United States Patent [19]

Shimoji et al.

[11] Patent Number: 5,319,229
[45] Date of Patent: Jun. 7, 1994

[54] SEMICONDUCTOR NONVOLATILE MEMORY WITH WIDE MEMORY WINDOW AND LONG DATA RETENTION TIME

[76] Inventors: Noriyuki Shimoji; Takanori Ozawa; Hironobu Nakao, all of c/o Rohm Co., Ltd., 21, Saiin Mizosaki-cho, Ukyo-ku, Kyoto, 615, Japan

[21] Appl. No.: 874,497

[22] Filed: Apr. 27, 1992

[30] Foreign Application Priority Data

Aug. 22, 1991 [JP] Japan ............... 3-210874

[51] Int. Cl.$^5$ ............... H01L 29/34; H01L 29/68; H01L 29/78
[52] U.S. Cl. ............... 257/324; 257/406; 257/411; 257/637; 257/640; 257/645; 437/42
[58] Field of Search ............... 257/324, 325, 326, 405, 257/406, 411, 637, 640, 645; 437/42

[56] References Cited

U.S. PATENT DOCUMENTS 4,288,470  9/1981  Bate et al. ............... 437/42

FOREIGN PATENT DOCUMENTS 55-87490  7/1980  Japan ............... 257/324
58-17673  2/1983  Japan ............... 257/411

*Primary Examiner*—Ngan Ngo
*Attorney, Agent, or Firm*—Falk, Vestal & Fish

[57] ABSTRACT

A semiconductor Nonvolatile memory. The memory cell has the following structure. Within a P type silicon substrate 3, there are provided an n+ type source 26 and an n+ type drain 28, the two regions forming a channel region 30. On top of the channel region 30 there are laminated a silicon dioxide film 5, an insulating layer which consists of the nitride film 18a,18b and 18c, and the oxide film 20a,20b and 20c. Further, on top of the insulating layer, there is formed a polysilicon film 24, which serves as a control electrode. By using the memory cell and row select transistor a semiconductor nonvolatile memory can be constructed.

3 Claims, 12 Drawing Sheets

SEMICONDUCTOR NONVOLATILE MEMORY WITH WIDE MEMORY WINDOW AND LONG DATA RETENTION TIME

BACKGROUND OF THE INVENTION

1. Field of the Invention

The present invention relates to semiconductor nonvolatile memory and, more particularly, to increase in its memory window and improvement of its ability in holding charges.

2. Description of the Prior Art

Referring to FIG. 1, there is shown an MNOS transistor memory cell. The MNOS (Metal-Nitride-Oxide-Semiconductor) field effect transistor is known to be useful as a memory cell of semiconductor nonvolatile memory, which has the following structure: a gate electrode 21, a silicon nitride layer 19, a silicon dioxide layer 17 and a P type silicon substrate 11 including a N+type source 13 and a N+type drain 15. The MNOS memory cell can be stored with information by applying electric field to it so that electrons are trapped in the silicon nitride layer 19. To write data into such a cell at a low programming voltage, a method of thinning the silicon nitride layer 19 can be utilized. However, there is a limit to this method because electrons entering the silicon nitride layer 19 are not trapped within the silicon nitride layer 19 because of shortage of trapping distance in this layer 19. This fact limits the thickness of the silicon dioxide layer 17 to 19 nm or more. Accordingly, the programming voltage is limited to 10 Volts.

A memory cell was reported which has new MONOS (Metal-Oxide- Nitride-Oxide-Semiconductor) structure and operates with a programming voltage lower than ever (Suzuki et al., Electronics, 1982, p.107–110).

A memory cell 1 having the above mentioned MONOS-structure is shown in schematic section in FIG. 2. In the figure, within a P type silicon substrate 3, there is provided N+type drain 7 and N+type source 9, the two regions forming a channel region 32. On top of the channel region 32 there is laminated a silicon dioxide film 5 (2.2 nm thick or so), a silicon nitride film 12 (3.0 nm or so) and a silicon dioxide film 14 (3.3 nm or so) in this order. Further, on top of the film 14 there is formed a polysilicon film 16, which serves as gate electrode. Meanwhile, the construction of the memory cell 1 can be illustrated using an energy band in FIG. 3.

The memory cell 1 constructed as mentioned above has two stable states: one in which a logic "0" has been written therein, that is, electrons are trapped in the silicon nitride film 12, and the other in which a logic "0" has been erased (a logic "1" has been stored), that is, electrons are not trapped in the silicon nitride film 12. The fact that the memory cell 1 can take the two stable states is utilized to fabricate memory.

Operations of writing and erasing information into and from the aforementioned memory cell 1 will be described with reference to the hysteresis loop as shown in FIG. 4. The horizontal axis in FIG. 4 represents gate voltage $V_g$ and the vertical axis threshold voltage $V_{th}$. The gate voltage $V_g$ is a voltage applied to the gate electrode 16 of the memory cell. The threshold voltage $V_{th}$ is a gate voltage at which a current begins to flow between the source and the drain when the voltage applied to the gate electrode is made to increase. In this case, the threshold voltage $V_{th}$ is given by $$V_{th} = 2\phi F + V_{FB} + \frac{1}{C} \times \sqrt{2\epsilon q N_A 2\phi F}$$

where $\epsilon$ is silicon dielectric constant, $N_A$ is the concentration of impurities within the substrate, $V_{FB}$ is the flat band voltage, C is the capacity of the gate insulating film, q is the quantity of electron charge dropped in the silicon nitride layer, and $\Phi F$ is the Fermi level (i.e. the potential energy state of an intrinsic semiconductor with 50% probability of being filled if no forbidden energy band exists).

To write a logic "0" into the memory cell 1, a high voltage which may be as much as some 6 V (Volts) is applied to the gate electrode 16 of the memory cell 1. As a result of this, an electric field that develops between the gate electrode 16 and the channel region 32 causes the electrons within the channel region 32 to have high energy, some of the electrons tunnelling through the silicon dioxide film 5, entering the silicon nitride film 12 and thus trapped therein.

Such a change in charge distribution causes the threshold voltage to increase up to around 1.2 V (see point Q1 in FIG. 4). This means that the memory cell 1 has been made to serve as an enhancement mode transistor having a threshold voltage of approximately 1.2 V. In addition, the threshold voltage will remain as it is even if the gate voltage is cut off (see point R1 in FIG. 4).

On the other hand, to erase the logic "0," and store a logic "1", it is necessary to make the trapped electrons return to the channel region 32. This is effected by generating an electric field of the opposite polarity to that produced when writing information by applying a voltage of some 6 V to the channel region 32 relative to the gate electrode 16.

Such a change in charge distribution causes the threshold voltage to change from some 1.2 V to some 0.4 V (see point S1 in FIG. 4). This means that the memory cell 1 has been made to serve as a depletion mode transistor having a threshold voltage of approximately 0.4 V. The state in which the logic "0" is erased is a state in which the memory cell 1 has stored a logic "1." In addition, the threshold voltage will remain as it is even if the gate voltage is cut off (see point T1 in FIG. 4).

Further, operations of writing and erasing data into and from the aforementioned memory cell 1 are now described with reference to the energy band view shown in FIG. 3.

In the case where a logic "1" is written into the memory cell 1, electrons charged with high energy due to the applied electric field are made to tunnel through the silicon dioxide film 5 with high potential level, flowing into the silicon nitride film 12. Then the electrons moving in the silicon nitride film 12 mostly trapped near the silicon dioxide film 14. By contrast, in the case where a logic "1" is erased, the trapped electrons are pulled by the electric field in the direction opposite to that in writing data, tunneling through the silicon dioxide film 5 with high potential level, so that they return to the p-type silicon substrate 3.

Referring next to the operation of reading information from the memory cell 1, it is determined whether a logic "0" is stored or a logic "1" is therein, by determining whether or not a current flows through the channel region 32 when a voltage of some 5 V is applied between the source 9 and the drain 7 of the memory cell 1 and a voltage Vs of some 0.8 V is applied to the gate electrode 16. More specifically, when a logic "1" is stored, the threshold voltage of the memory cell 1 a value of appropriately 0.4 V, as shown at point 51 in FIG. 4 However, since the memory cell 1 acted as a depletion mode transistor because of the voltage Vs applied to the gate electrode, the channel regions 32 are conductive. Thus there flows a current through the channel region 32. Meanwhile, when a logic "0" is stored, the threshold voltage of the memory cell 1 is at a positive value of appropriately 1.2 V. Since the memory cell 1 is an enhancement mode transistor where programmed to store a logic "0", even when the voltage Vs applies to the electrode 16, the channel region 32 is non-conductive. Thus there does not flow a current through the channel region 32.

Semiconductor nonvolatile memory (not shown) is constructed by using the memory cells 1 described above and row select transistors (not shown).

However, the conventional memory using the memory cells 1 have the following problems.

In the memory cell 1 with the structure as mentioned above, writing operation is able to be performed at a voltage of some 6 V. But it frequently occurs that the width of the resulting memory window of the memory cell 1 is small. This means the number of electrons trapped in the silicon nitride films 12 is few. The width of the memory window is defined as the difference between the high and low threshold voltages in the hysteresis loop shown in FIG. 4. When the width of the memory window is too small, it is impossible to distinguish between one information thereon (that is, a state where electrons is trapped in the silicon nitride film 12) and the other information (that is, a state where electrons are not trapped in the silicon nitride film 12), so that information may be read out by mistake.

Moreover, long term use of the memory cell 1 tends to decrease the width of memory window. Accordingly, to insure that the memory operates correctly for an adequate lifespan (about 10 years), it is required to prevent reduction in the width of the memory window and maintain the ability to trap and hold charges.

Meanwhile, it is arranged that the silicon dioxide film 5 is so thin that information thereon can be written into the memory cell at a low voltage of some 6 V. This is why trapped electrons in writing operation can return the channel region 32. In other word, the memory cell has disadvantages in its ability of holding charges so that information may be read out by mistake.

SUMMARY OF THE INVENTION

Accordingly, it is an object of the present invention to provide nonvolatile semiconductor memory in which information is written at low voltage of some 6 volts and from which the information has been able to be read correctly for an adequate term.

It is a further object of the present invention to provide nonvolatile semiconductor memory having its greater ability in holding charges than ever.

A semiconductor device including nonvolatile memories according to an embodiment of the invention, comprises:

a first conductive type semiconductor region;

a pair of second conductive type diffusion regions formed within the first conductive type semiconductor region;

a first insulating layer formed on the first conductive type semiconductor region;

a second insulating layer formed on the first insulating layer, the second insulating layer being composed of nitride films and oxides films;

a third insulating layer formed on the second insulating layer, the third insulating being composed of oxide film; and a control electrode formed on the third insulating layer.

A method for manufacturing a semiconductor device including nonvolatile memories according to an embodiment of the invention, comprises the steps of:

preparing a substrate of semiconductor monocrystala having a first conductive type semiconductor region;

forming a first insulating layer by oxidation on the substrate;

forming a second insulating layer composed of nitride films and oxide films on the first insulating layer;

forming a third insulating layer composed of oxide film on the second insulating layer;

growing a control electrode layer on top of the third insulating layer;

etching the control electrode layer using a resist pattern as a mask to form a control electrode; and forming a pair of second conductive type diffusion regions within the first conductive type semiconductor region by diffusing a second conductive type dopant.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
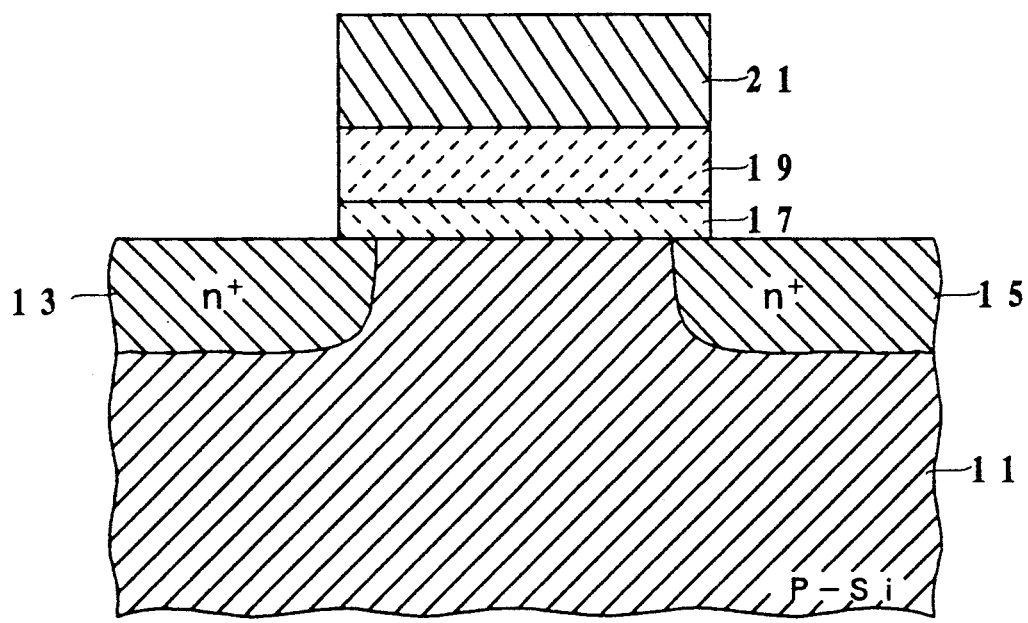
FIG. 1 is a view schematically showing the construction in section of a MNOS-structure memory cell.
Figure 2:
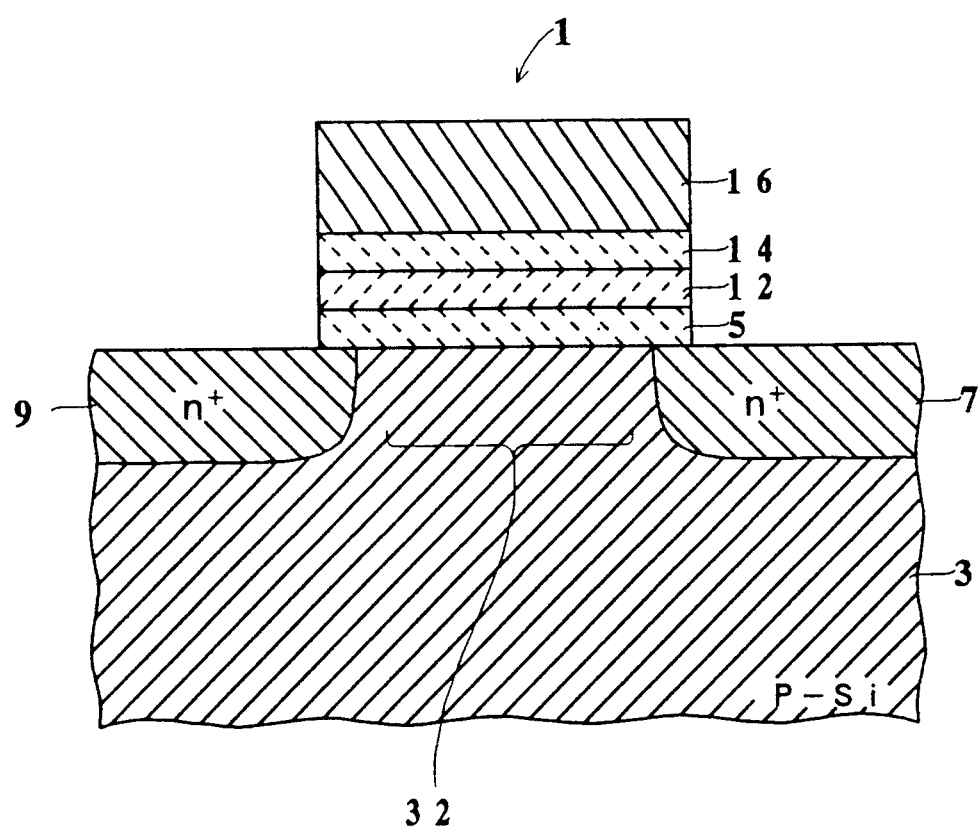
FIG. 2 is a view schematically showing the construction in section of a another conventional memory cell 1.
Figure 3:
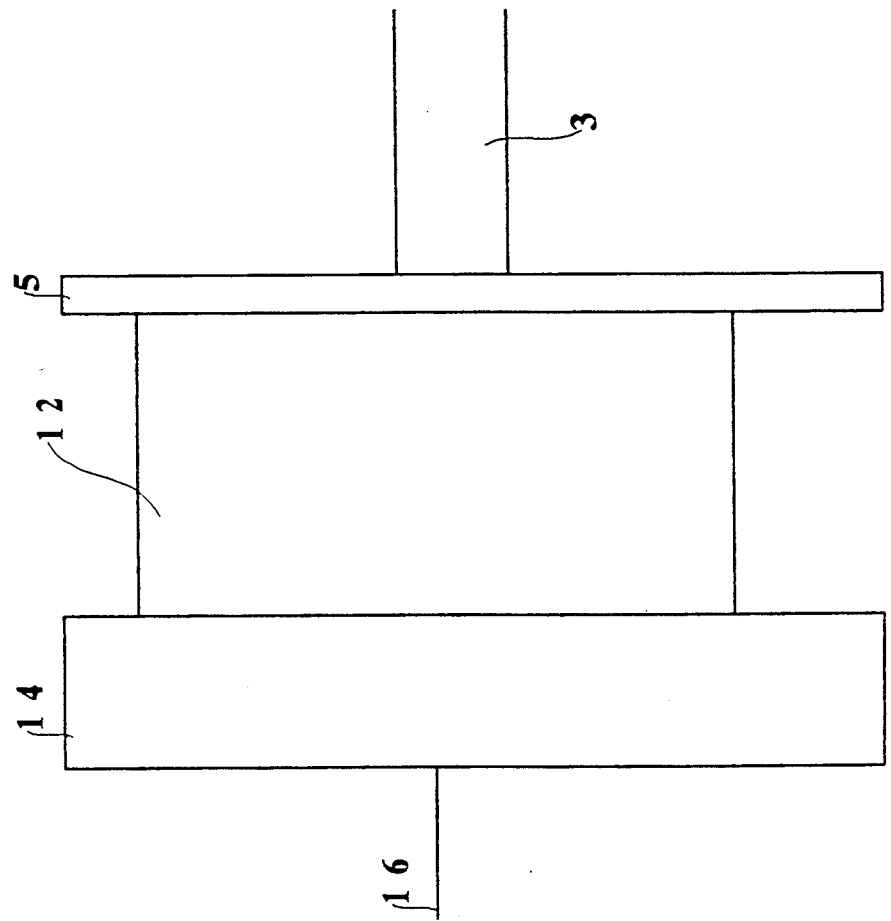
FIG. 3 is an energy band diagram of the conventional memory cell 1.
Figure 4:
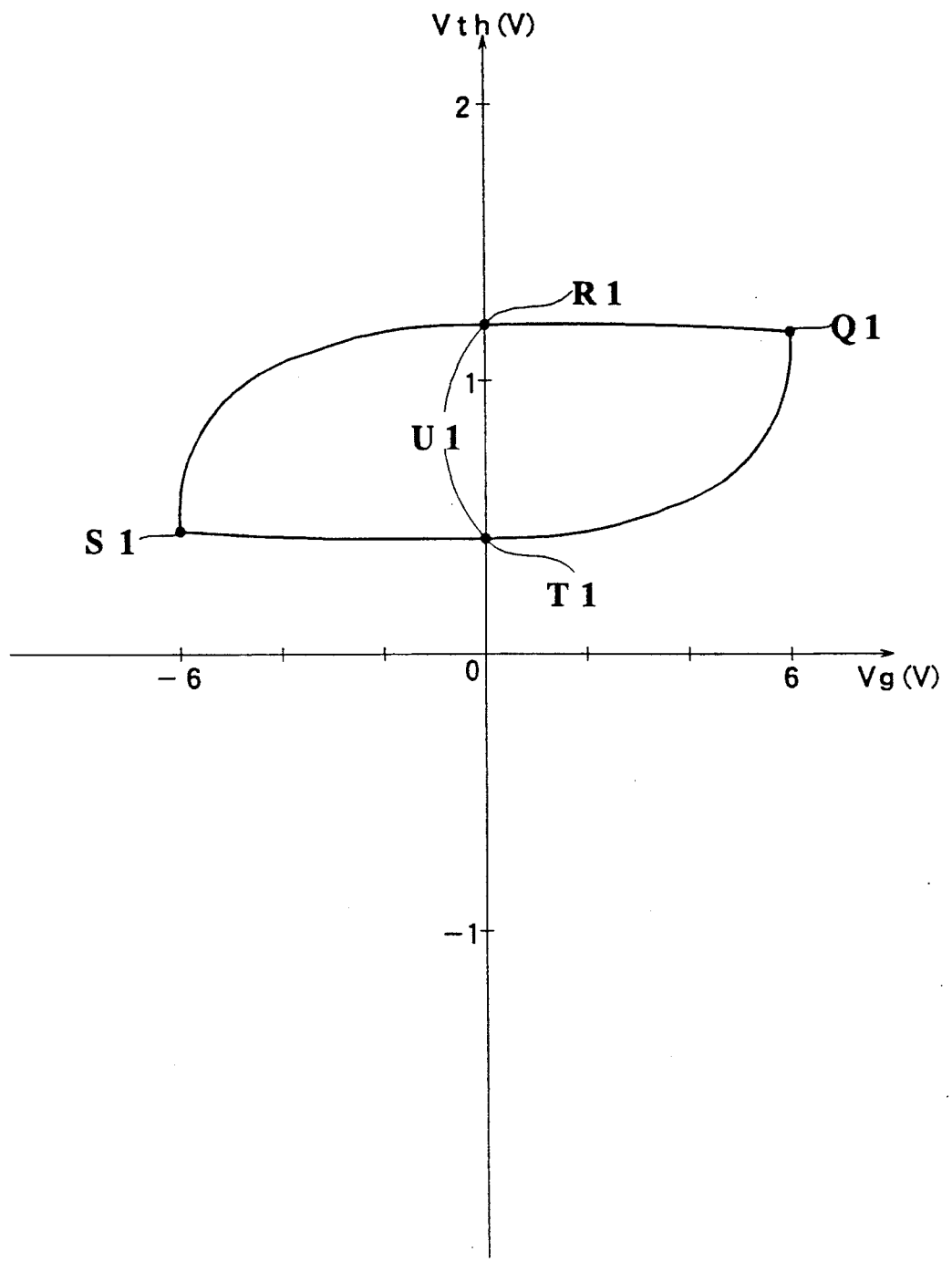
FIG. 4 is a view showing the hysteresis loop for threshold voltage of the memory cell 1.
Figure 5:
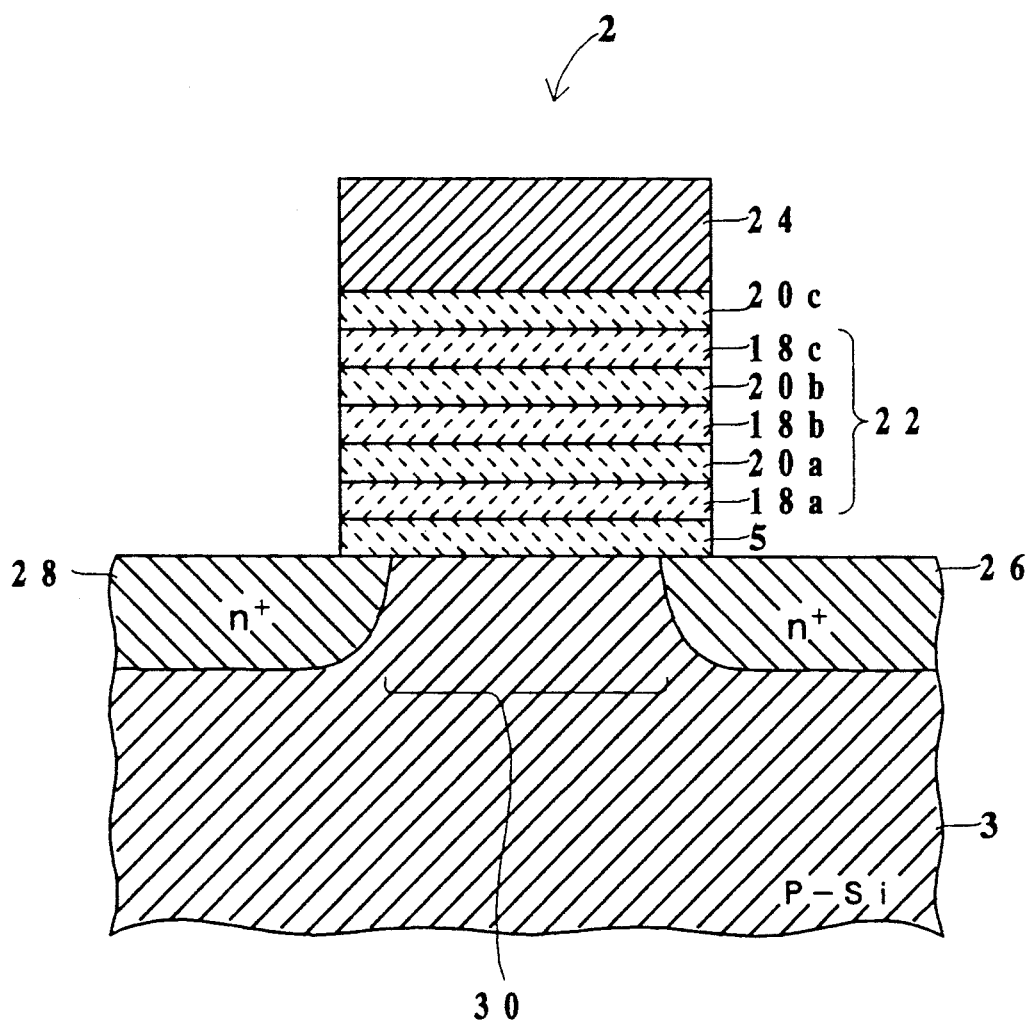
FIG. 5 is a view showing the construction in section of a memory cell 2 according to an embodiment of the present invention.

A memory cell 2 according to an embodiment of the present invention is shown in schematic section in FIG. 5. A manufacturing process for the memory cells 2 having the construction as shown in FIG. 5 will be described with reference to FIGS. 6A and 6B, and, FIGS. 7A and 7B.

Figure 6A:
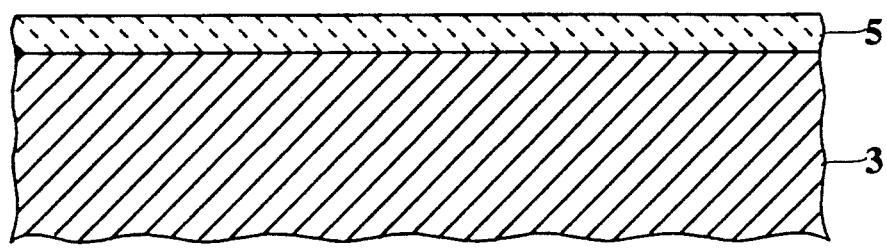
FIGS. 6A and 6B are views showing the manufacturing process of the memory cell 2.
Figure 6B:
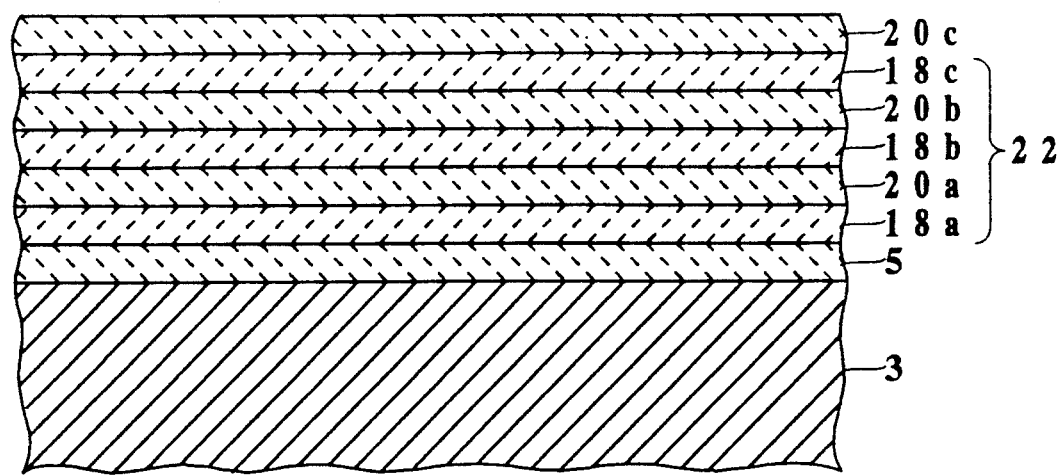
Figure 7A:
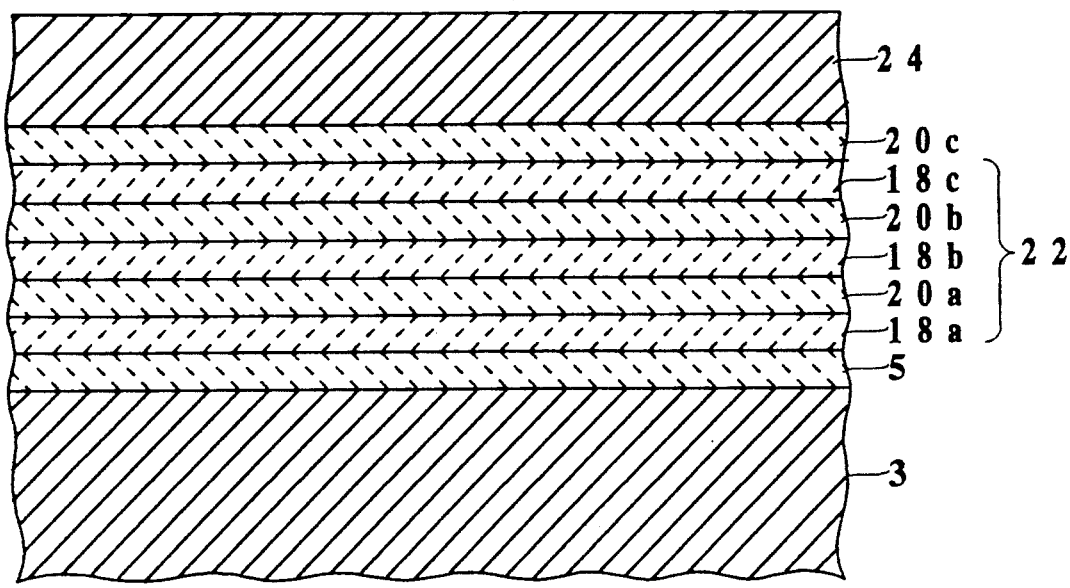
FIGS. 7A and 7B are views showing the manufacturing process of the memory cell 2.
Figure 7B:
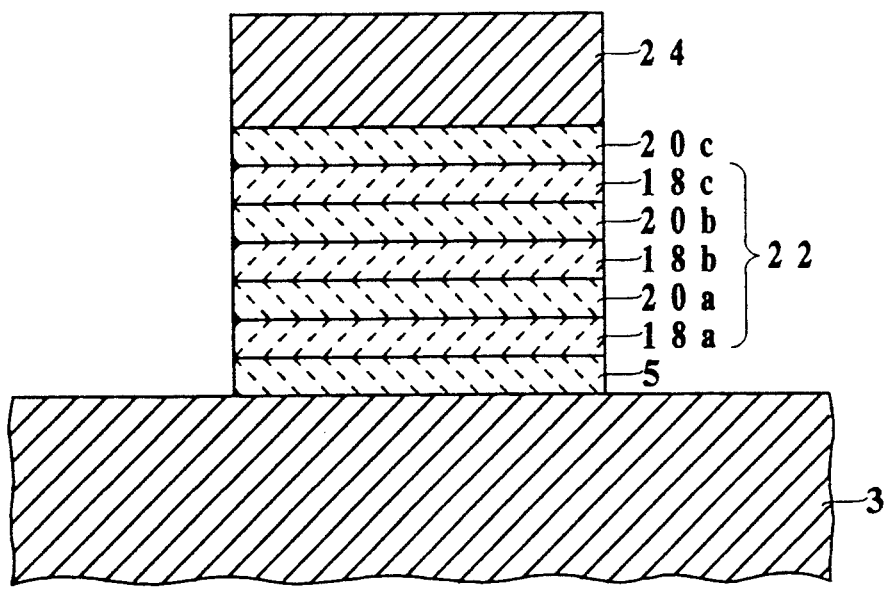

With a thin-film p-type silicon substrate 3 comprised of a first conductive type semiconductor substrate prepared, a silicon dioxide film 5 (approximately 2.0 nm thick), that is a first insulating layer, is formed on top of the silicon substrate 3 by thermal oxidation (FIG. 6A). Then, there are deposited a low pressure SiN film 18a on top of the substrate 3 by low pressure CVD and oxidation is subjected to this low pressure SiN film 18a so that a portion of 20 percent from upper face of the low pressure SiN film is changed into an oxide film 20a. The reminder of the low pressure SiN film is a nitride film 18a. This process is repeated until forming a second insulating layer 22 shown in FIG. 6B which consists of the nitride films 18a, 18b and 18c and the oxide films 20a and 20b, and a third insulating layer 20c composed of oxide film situated on the nitride film 18c (see FIG. 6B). Thereafter, a polysilicon layer 24 is grown on top of the second insulating layer 22 by the CVD process (FIG. 7A). The result is then subjected to etching using resist as a mask thereby forming the polysilicon layer 24 served as an control electrode 24, the second insulating layer 22 and the silicon dioxide film 5 (FIG. 7B) into the gate structure shown in FIG. 5 over channel 30. Next, arsenic or phosphorus is ion-implanted and thermally diffused, thereby forming a self-aligne n+ drain 26 and n+ source 28 (see FIG. 5). As a result of this step, a channel region 30 is formed between the n+ drain 26 and the n+ source 28.

Operation of writing data into and erasing data from the memory cell 2 will described below.

To write a logic "0" into the memory cell 2, a voltage of approximately 6 V is applied to control electrode 24 of the memory cell 2 relative to the channel region 30 thereof. As a result of application of this write voltage, an electric field develops between the control electrode 24 and the channel region 30 which causes electrons within the channel region 30 to have high potential energy. As a result, some of the electrons tunnel through the silicon dioxide film 5 and some of those electrons become trapped in the silicon nitride film 18a. Furthermore, the non-trapped electrons tunnel through the silicon dioxide film 20a and also some of those electrons become trapped in the nitride film 18b. Similarly, the non-trapped electrons tunnel through the silicon dioxide film 20b and also some of those electrons become trapped in the nitride film 18c. This stable state means that a logic "0" has been written into the memory cell 2.

On the other hand, to write a logic "1" or erase the logic "0", it is necessary to make the trapped electrons return to the channel region 30. To do this, a voltage of some 6 V is applied to the channel region 30 relative to the electrode 24 so that an electric field is generated in the direction opposite (opposite polarity) to the electric field applied in writing the stored data thereby making the trapped electrons return to the channel region 30.

Figure 8:
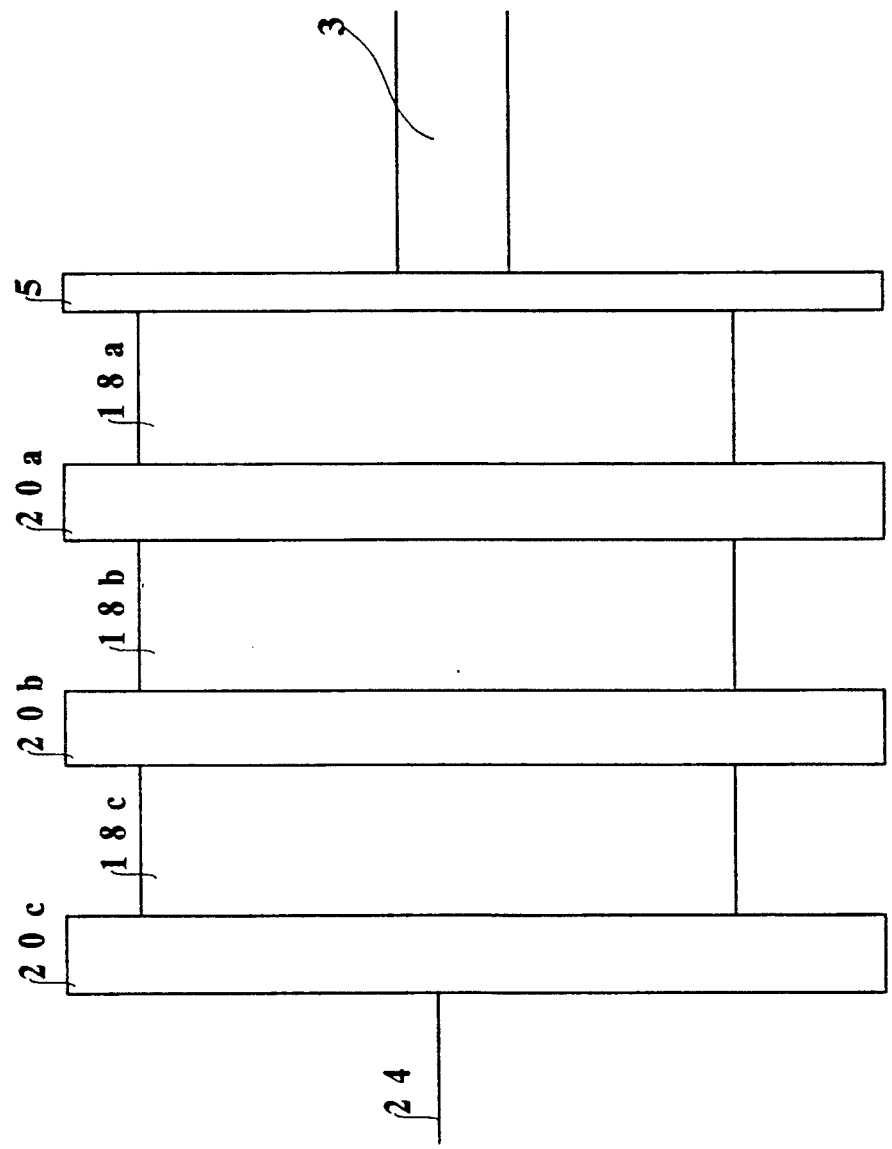
FIG. 8 is an energy band diagram of the memory cell 2.

Furthermore, the structure of the memory cell 2 can be illustrated using an energy band diagram shown in FIG. 8.

Referring to FIG. 8, operation of writing and erasing in the memory cell 2 will be described. In writing operation, electrons charged with high energy due to an applied electric field are made to tunnel through the silicon dioxide film 5 whereupon they flow into the second insulating layer 22. The flowed electrons move within the silicon nitride film 18a and some of them become trapped near the boarder of the silicon dioxide film 20a. Similarly, the non-trapped electrons tunnel through the film 20a and move within the nitride film 18b, and some of them became trapped near the boarder of the silicon dioxide film 20b. Furthermore, the non-rapped electrons tunnel through the film 20b and move within the nitride film 18c, and some of them become trapped near the silicon dioxide film 20c. Due to the fact that there are a great number of interfaces between the silicon dioxide films and the silicon nitride films, the resulting density of trapped electrons is high, and electrons are therefore efficiently trapped. By contrast, for erasing stored information, the trapped electrons are pulled by an electric field in the direction opposite to that used in writing information. These electrons tunnel through the silicon dioxide films and return to the p-type silicon substrate 3.

Figure 9:
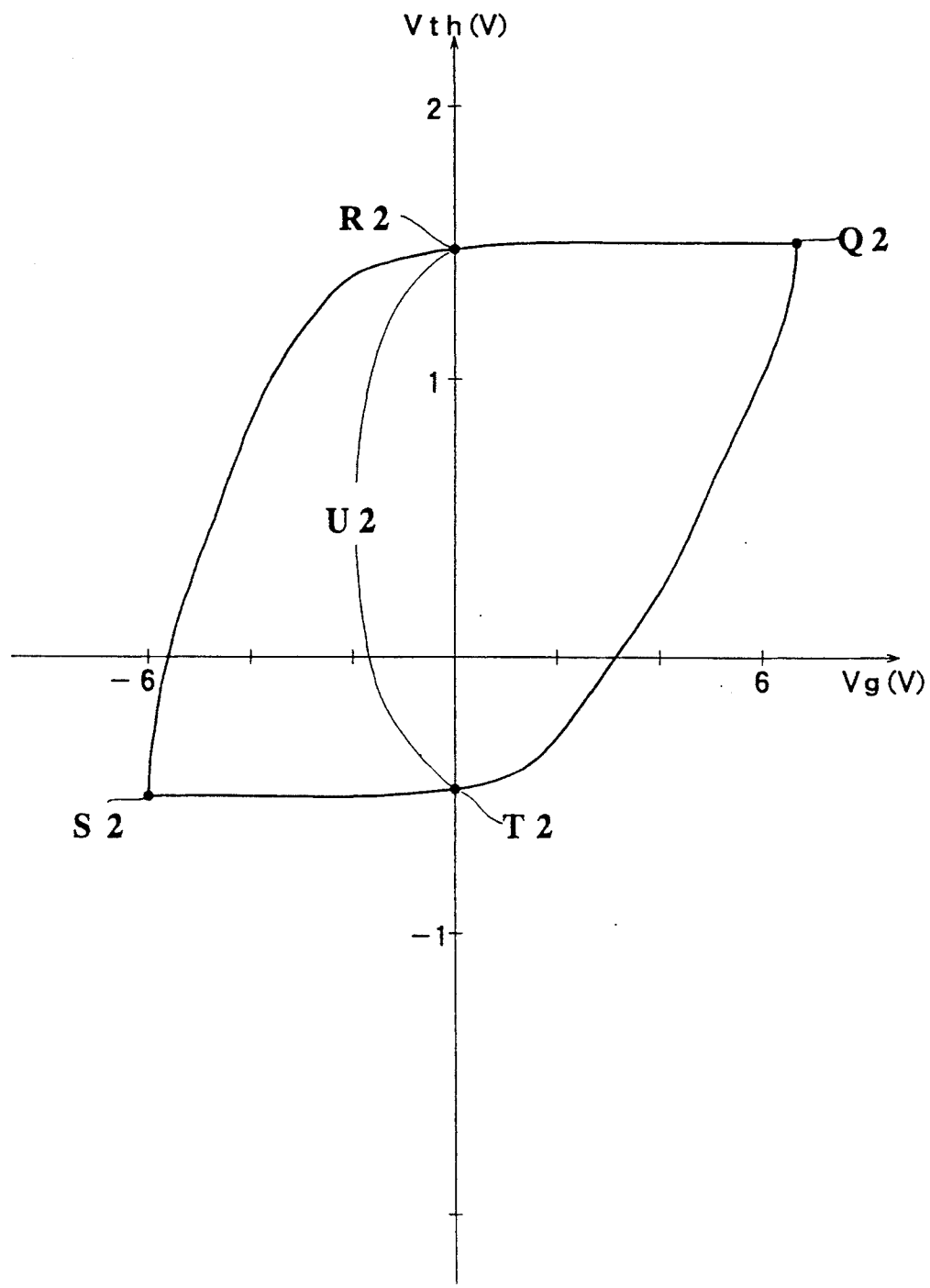
FIG. 9 is a view showing the hysteresis loop for threshold voltage of the memory cell 2.

The above-described charge distribution change is detailed below with reference to the hysteresis loop of the memory cell 2 shown in FIG. 9. In writing a logic "0" into the memory cell 2, a voltage is applied to the control electrode 24 relative to the channel region 30 thereby causing electrons to lie trapped in the silicon nitride regions 18a, 18b and 18c. Such a change in charge distribution causes the threshold voltage to increase up to about 1.5 V (see point Q2 in FIG. 9). This means that the memory cell 2 has been made to behave like an enhancement mode transistor having a threshold voltage of approximately 1.5. In addition, the threshold voltage will remain at approximately 1.5 volts as it is even if the voltage on electrode 24 is cut off (see point R2 in FIG. 9).

To erase a stored logic "0" and store a logic "1", an electric field is applied in the direction opposite to that used in writing data thereby making the electrons return to the channel region 30. This change in charge distribution causes the threshold voltage to change from about 1.5 V to about −0.5 V (see point S2 in FIG. 9). This means that the memory cell 2 has been made to behave like a depletion mode transistor having a threshold voltage of approximately −0.5 V. In addition, the threshold voltage will remain as it is at about −0.5 volts even if the gate voltage on electrode 24 is cut off (see point T2 in FIG. 9).

Referring next to the process of reading data stored in the memory, it may be determined whether a logic "1" or a logic "0" is stored in the memory cell 2 by determining whether or not a current flows through the channel region 30 when a voltage is applied between the source 28 and the drain 26 of the, memory cell 2 with no gate voltage applied to the polysilicon electrode 24.

More specifically, when a logic "1" is stored, the threshold voltage of the memory cell 2 is at a negative value of approximately −0.5 V, as described above. Since the memory cell 2 behaves like a depletion mode transistor in this state, the channel region 30 is conductive. As a result, a current flows through the channel region 30. By contrast, when a logic "0" is stored, the threshold voltage of the memory cell 2 is at a positive value of approximately 1.5 V. Accordingly, the memory cell 2 behaves like an enhancement mode transistor, and the channel region 30 is non-conductive because no gate voltage is applied and the threshold voltage is not exceeded. As a result, no current flows through the channel region 30.

Next, an example of an LSI memory constructed using the aforementioned memory cell 2 will be given. First described is the principle of operation involved when data is written.

Figure 10:
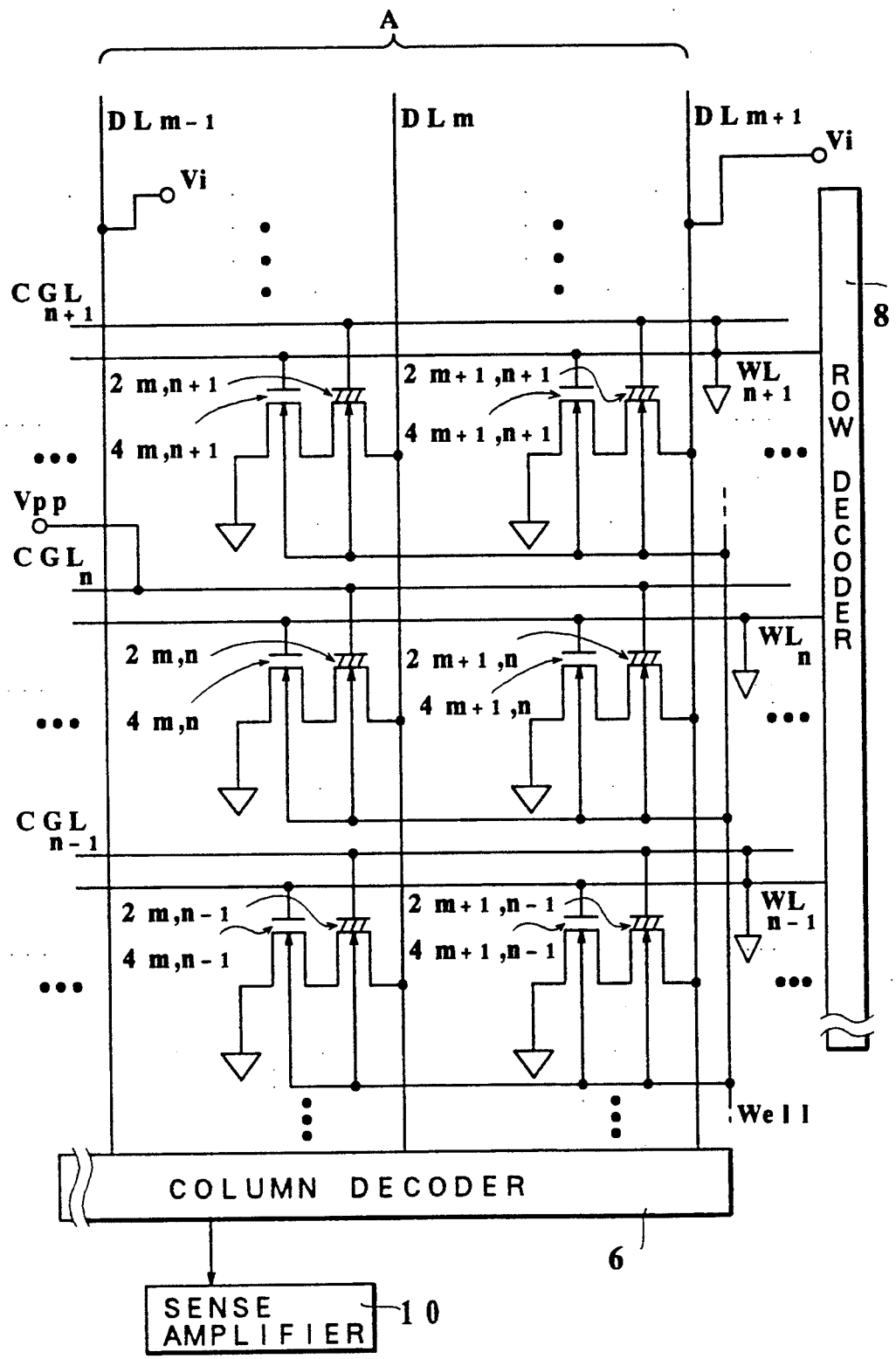
FIG. 10 is a drawing of an LSI memory to illustrate how data is written into memory cells according to an embodiment of the present invention.

A conceptual view of the construction of a 1024-bit memory LSI is shown in FIG. 10. A memory cell array A is 32 rows by 32 columns for a total of 1024; memory storage locations. To the source 28 of each memory cell 2 is connected the drain of row select transistor 4. A row decoder 8 drives word lines WL which are each connected to the gate electrode of each row select transistor 4. Control gate lines CGL are each connected to the control electrode 24 of each memory cell 2 to assist in writing data into the array. A column decoder 6 drives column data lines DLs which are each connected to the drain 26 of each memory cell 2. To each p-type silicon substrate 3 is connected a well line Well.

Now the way in which data (a logic "0") is written into a memory cell $2_{m,n}$ will be described. To write the information into a memory cell at column m and row n, a programming voltage $V_{pp}$ is applied to the control gate line $CGL_n$. To the data lines other than the data line $DL_m$, a programming inhibit voltage $V_i$ is applied by the column decoder 6. To the word line $WL_n$, ground voltage equal in potential to the substrate is applied. Therefore, of all the memory cells 2 connected to the control gate line $CGL_n$ to which the programming voltage $V_{pp}$ is applied, only the memory cell $2_{m,n}$ at column m and row n has the proper potentials applied at drain, source, gate and substrate to program data therein. This is because the memory cell $2_{m,n}$ is connected to the data line $DL_m$, which is the only data line to which the programming inhibit voltage $V_i$ is not applied. As a consequence, the electric field effect caused by the programming voltage $V_{pp}$ acts only on the memory cell $2_{m,n}$, thereby causing the electrons within the channel region to be trapped in the silicon nitride films. In this manner, a logic "0" is written only into the memory cell $2_{m,n}$.

Figure 11:
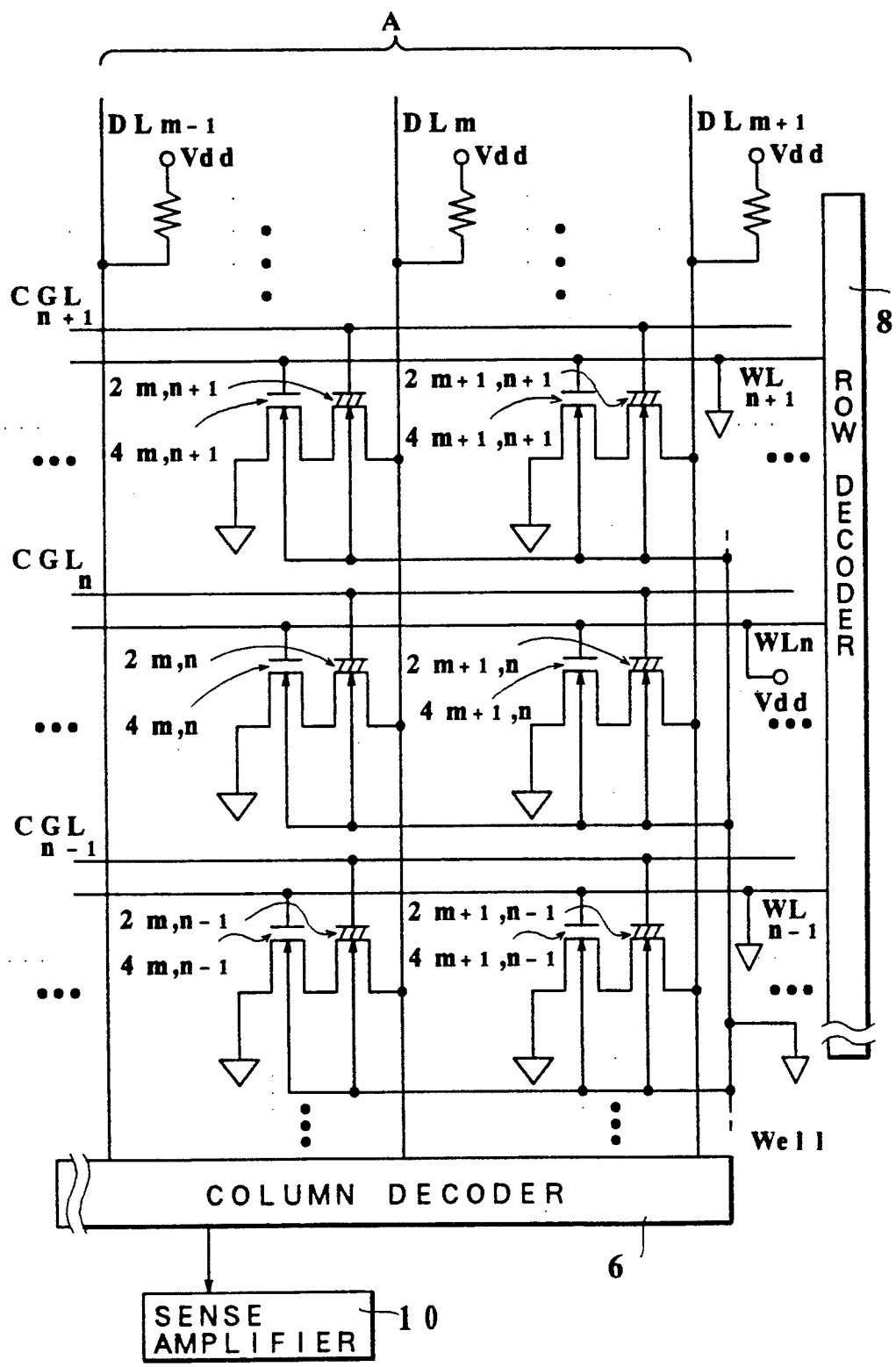
FIG. 11 is a drawing of an LSI memory to illustrate how data is read from memory cells according to an embodiment of the present invention.

The principle of operation for reading information from the memory cell $2_{m,n}$ is described below with reference to FIG. 11. The construction shown in FIG. 11 is the same as shown in FIG. 10. To read data, a voltage $V_{dd}$ is applied only to the world line $WL_n$ by the row decoder 8. The voltage Vaa is also applied via a resistor 30 to all the data lines DL. In this state, since the channel region 30 of the memory cell $2_{m,n}$ in which a logic "0" is stored is non-conductive, as mentioned before, the current flowing through data line $DL_m$ is not conducted to ground through cell $2_{m,n}$ and its select transistor and, therefore, it is injected into the column decoder 6 without loss to ground.

Conversely, when the memory cell $2_{m,n}$ has a logic "1" stored therein its channel region 30 is conductive. Since the voltage Vaa is also applied to the gate electrode of the row select transistor $4_{m,n}$ (that is, the row select transistor $4_{m,n}$ is in the ON state), the current flowing through each data line $DL_m$ is directed to ground via the conductive memory cell $2_{m,n}$ and the channel of the row select transistor 4.. As a result, the column decoder 6 has no input of current from the data line DL.

The column decoder 6 is arranged to put out only the current from the data line $DL_m$. This output is amplified and read by the sense amplifier 10. Thus, only the data from the memory cell $2_{m,n}$ is read out.

Figure 12:
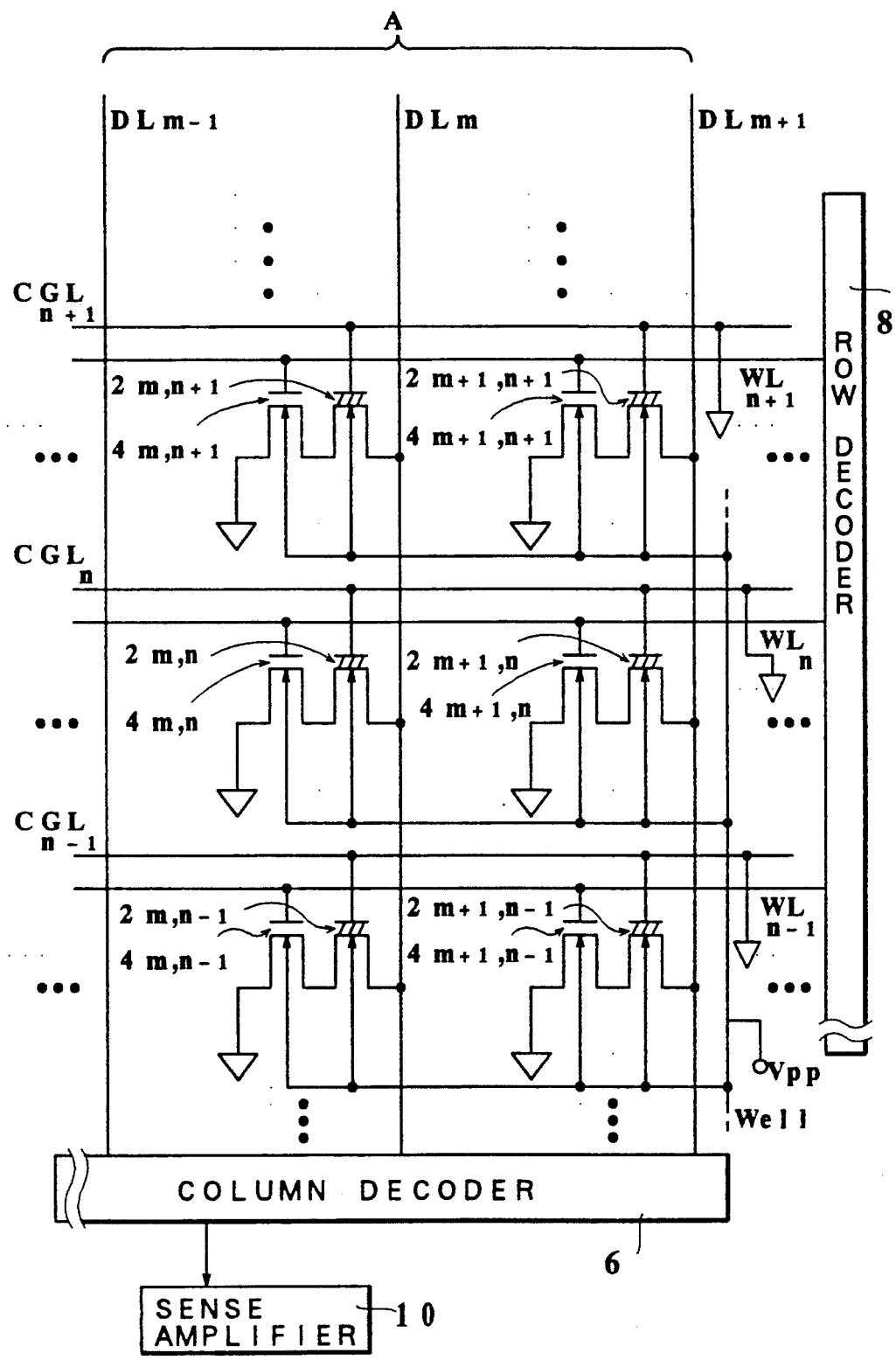
FIG. 12 is a drawing of an LSI memory to illustrate the process of erasing information stored in memory cells according to an embodiment of the present invention.

Next, process of batch erasing of information stored in the aforementioned 1024-bit memory LSI is described with reference to FIG. 12. The construction in shown in FIG. 12 is the same as shown in FIG. 10. With each control gate lines CGL grounded, a programming voltage $V_{pp}$ is applied to the p-type silicon substrate 3 of each memory cell 2 via the well line Well. At this point, the electrons trapped in nitride films 18a, 18b and 18c of FIG. 5 return to the channel region 30 under the influence of the electric field caused by the erase voltage applied to the well line. In consequence, all the stored logic "0s" are erased and, all the memory cells 2 have logic "1s" stored therein.

In addition, although the first conductive type has been assumed to be p-type and the second to be n-type in the above embodiment, in alternative embodiment, the first conductive type is n-type and the second is p-type.

The nonvolatile semiconductor memory according to the present invention is characterized in that the second insulating layer is composed of nitride films and oxide films. The oxide films in second insulating layer serves as brake on electrons moving in the second insulating layer when writing information. Further, interface of oxide films and nitride films can trap electrons more than any other area of nitride film.

Therefore, the nitride films can trap more many electrons than ever. This fact allows the memory cell to have sufficient width of memory window to have be reading information correctly for long time (about 10 years), even when information is written therein at the voltage of some 6 V.

The nonvolatile semiconductor memory according to the present invention is further characterized in that the second insulating layer is such that the nitride layer and the oxide layer, in this order, are piled.

Therefore, the structure wherein the nitride film in sandwiched between two oxide films prevent trapped electrons from leaking in the first conductive type substrate or the control electrode. In other word, the number of trapped electrons which leak in the first conductive type substrate or the control electrode is few. This means that improvement of the memory cell's ability in holding charges.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including nonvolatile memories comprising:
   a first conductive type semiconductor region;
   a pair of second conductive type diffusion regions formed within the first conductive type semiconductor region;
   a first insulating layer formed on the first conductive type semiconductor region;
   a second insulating layer formed on the first insulating layer, the second insulating layer being composed of a plurality of silicon nitride films and a plurality of silicon dioxide films;

a third insulating layer formed on the second insulating layer, the third insulating layer being composed of silicon dioxide film; and a control electrode formed on the third insulating layer.

2. A semiconductor device including nonvolatile memories according to claim 1, wherein the plurality of silicon nitride films and the plurality of silicon dioxide films are deposited on the first insulating layer one after the other.

3. A semiconductor device including nonvolatile memories according to claim 2, wherein the pair of second conductive type diffusion regions consist of a source layer and a drain layer, so that a conductive channel is created between the source layer and the drain layer by applying a voltage to the control electrode.

* * * * *